(12) United States Patent
Koyanagi et al.

(10) Patent No.: US 6,763,407 B1
(45) Date of Patent: *Jul. 13, 2004

(54) DIGITAL-TO-ANALOG CONVERTER WITH PLURAL VOLTAGE HOLDING SECTIONS, PLURAL STEP FUNCTION GENERATORS, VOLTAGE SUMMING SECTION AND INTEGRATOR

(75) Inventors: Yukio Koyanagi, jouetsu (JP); Kazuo Toraichi, Sayama (JP)

(73) Assignee: Niigata Seimitsu Co., Ltd., Niigata (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/719,621
(22) PCT Filed: Jun. 8, 1999
(86) PCT No.: PCT/JP99/03047
§ 371 (c)(1),
(2), (4) Date: Dec. 14, 2000
(87) PCT Pub. No.: WO99/66642
PCT Pub. Date: Dec. 23, 1999

(30) Foreign Application Priority Data

Jun. 17, 1998 (JP) .......................... 10-186835

(51) Int. Cl.[7] .............................................. G06F 13/12
(52) U.S. Cl. .................... 710/69; 341/144; 341/147
(58) Field of Search ................... 710/69; 341/144, 341/147

(56) References Cited

U.S. PATENT DOCUMENTS

| | | | |
|---|---|---|---|
| 3,617,880 A | * 11/1971 | Cormack et al. ........... 324/642 |
| 3,745,561 A | * 7/1973 | Van Dijk et al. ........... 341/120 |
| 3,781,626 A | * 12/1973 | Kubo et al. ................. 318/561 |
| 4,430,641 A | * 2/1984 | Baur et al. .................. 341/118 |
| 4,647,907 A | * 3/1987 | Storey ........................ 341/118 |
| 5,124,939 A | 6/1992 | Mori et al. |
| 6,411,238 B1 | * 6/2002 | Koyanagi et al. ........... 341/144 |

FOREIGN PATENT DOCUMENTS

| | | |
|---|---|---|
| JP | 1-296714 | 11/1989 |
| JP | 3-217126 | 9/1991 |
| JP | 4-137907 | 5/1992 |

OTHER PUBLICATIONS

Kamada M. et al.: "Quadratic Spline Interpolator", International Journal of Systems Science, London, GB, vol. 27, No. 10, 1996, pp. 977–983, XP002920155, ISSN: 0020–7721, p. 978–p. 979; figures 2–4.

Kamada M. et al.: "A Smooth Signal Generator Based On Quadratic B–Spline Functions", IEEE Transactions on Signal Processing, IEEE, Inc. New York, US, vol. 43, No. 5, May 1995, pp. 1252–1255 XP002920156, ISSN: 1053–587X, p. 1253–p. 1254; figures 2,3.

Kazuo Toraichi et al.: "A Quadratic Spline Function Generator", IEEE Transactions On Acoustics, Speech And Signal Processing, IEEE Inc. New York, US, vol. 37, No. 4, Apr. 1, 1989, pp. 534–543, XP000118998, ISSN: 0096–3518, abstract; figures 6, 7, 10.

Hiroyuki Mizuno, et al., "Analog Signal Processing Technology", Nikkei Business Publications, Inc., Jun. 1991, p. 39.

\* cited by examiner

Primary Examiner—Jeffrey Gaffin
Assistant Examiner—Justin Knapp
(74) Attorney, Agent, or Firm—Dellett & Walters

(57) ABSTRACT

A digital-to-analog converter for generating output waveforms with less distortion without the need for high-speed components. The digital-to-analog converter comprises a D/A converter, four voltage holding sections, four step function waveform generators, a voltage summing section, two integrators and a timing controller. The voltages corresponding to four sequential digital data inputs are held in the voltage holding sections, respectively, and the step function generators generate step function waveforms at the voltage levels corresponding to the held voltages. The voltage summing section combines the step function waveforms generated in the step function waveform generators, and two integrators integrate this combined waveform two times, thus producing a continuous analog voltage composed of the input digital data.

9 Claims, 12 Drawing Sheets

DIGITAL-TO-ANALOG CONVERTER WITH PLURAL VOLTAGE HOLDING SECTIONS, PLURAL STEP FUNCTION GENERATORS, VOLTAGE SUMMING SECTION AND INTEGRATOR

BACKGROUND OF THE INVENTION

1. Field of the Invention

The present invention relates to a digital-to-analog converter for converting discrete digital data into continuous analog signals. In this specification, it is assumed that a case where function values have finite values except zero in a local region and become zero in regions different from the region is called a "local support."

2. Description of the Prior Art

A recent digital audio apparatus, for example, a CD (Compact Disk) player, uses a D/A (digital-to-analog) converter to which an over-sampling technique is applied to obtain a continuous analog audio signal from discrete music data (digital data). Such a D/A converter generally uses a digital filter to raise a pseudo sampling frequency by interpolating input digital data, and outputs smooth analog voice signals by passing each interpolation value through a low-pass filter after generating a staircase signal waveform with each interpolation value held by the sample holding circuit.

A data interpolating process is performed with a digital filter contained in a D/A converter using a sampling function generally referred to as a sinc function. FIG. 16 is an explanatory graph of a sinc function. This sinc function is obtained when a Dirac delta function is inverse-Fourier-transformed, and is defined as $\sin(\pi ft)/(\pi ft)$ where the sampling frequency is f. This sinc function becomes one only at a sample point, where t=0, and zero at all other sample points.

Conventionally, an oversampling process is performed using a digital filter in which a waveform data of the sinc function is set to a tap counter of an FIR (finite impulse response) filter.

In the oversampling technology for performing an interpolating operation on discrete voice data using a digital filter, a low-pass filter having a moderate attenuation characteristic can be applied. Therefore, the phase characteristic with a low-pass filter can approach a linear phase characteristic, and the sampling aliasing noise can be reduced. Such an effect becomes more outstanding with a higher pseudo sampling frequency. However, when a sampling frequency rises, the processing speed of the digital filter and the sample holding circuit is also increased. Therefore, expensive parts applied in the high-speed process are required, thereby raising the entire parts cost. In addition, when a high sampling frequency (for example, several MHz) is necessary for image data, etc., a digital filter for oversampling and a sample holding circuit have to be mounted using parts operated around several ten MHz to several hundred MHz, which cannot be easily realized.

In addition, even when the oversampling technology is used, a smooth analog signal is generated by passing a staircase signal waveform through a low-pass filter. Therefore, when a low-pass filter is used, a linear phase characteristic in the strict sense cannot be expected. Furthermore, the above mentioned sinc function is a function converging to 0 at $\pm\infty$. Therefore, when a correct interpolation value is computed, all digital data values should be considered. However, for convenience of a circuit size, etc., the number of tap counters of a digital filter is set so as to the range of digital data to be taken into account is limited. Therefore, an obtained interpolation value contains a truncation error.

Thus, the conventional D/A converter using the oversampling technology requires parts for a high-speed operation to raise a pseudo sampling frequency, thereby incurring a high cost or realizing a necessary system with difficulty. Furthermore, the deterioration of the phase characteristic arises from using a low-pass filter, and a truncation error is contained because the digital filter to which a sinc function is applied is used. Therefore, distortion of output waveform according to the deterioration of the phase characteristic and the truncation error occurs.

BRIEF SUMMARY OF THE INVENTION

The present invention has been developed based on the above mentioned problems, the object of the present invention is to provide a digital-to-analog converter capable of obtaining an output waveform with less distortion without increasing the speed of operating parts.

A digital-to-analog converter of the invention comprises generating the step function waveforms having the voltage levels corresponding to respective input digital data, synthesizing the generated step function waveforms, and making the analog integral operations plural times to produce a continuous analog signal that connects smoothly the voltages corresponding to the digital data input successively. In this way, because of generating the predetermined step function waveforms corresponding to plural digital data input successively, synthesizing the generated step function waveforms, then integrating synthesized waveforms to get a continuous analog signal, there is no need of using a low-pass filter to get a final analog signal. Therefore, there is no deterioration of the group delay characteristic caused by variable phase characteristic depending on the frequency of a signal to be processed, resulting in an output waveform with less distortion. Also, since there is no need of speeding up the operation rate of parts, and using expensive parts, unlike the conventional method that performed the oversampling, it is possible to reduce the part costs.

In particular, the above-described step function waveform is preferably obtained by differentiating a sampling function consisting of a piecewise polynomial multiple times. On the contrary, the waveform corresponding to the predetermined sampling function can be obtained by integrating this step function waveform multiple times. Therefore, the convolution operation using the sampling function can be equivalently performed generating the step function waveform, so that the processing contents can be simplified, and the volume of processing required for converting digital data to analog signal can be reduced.

The above-described sampling function is preferably differentiable only once over the whole range, and has values of a local support. It is considered that it is necessary that various signals existing in the natural world have differentiability because the signals change smoothly. Nevertheless, it is considered that it is not necessary that the differentiability is not always infinite, and that it is possible to sufficiently approximate natural phenomena so long as the signal scan be differentiated only once. In this manner, although there are many advantages by using a sampling function of the local support that can be differentiated finite times, conventionally, it was considered that a sampling function fulfilling these conditions did not exist. Nevertheless, by the present inventor's research, a function fulfilling the conditions described above is found.

More specifically, the above-described sampling function is a function of local support having the values other than zero in a range where the sample point t is from −2 to +2. This sampling function is defined such that:

$(-t^2-4t-4)/4$ for $-2 \leq t < -3/2$, $(3t^2+8t+5)/4$ for $-3/2 \leq t < -1$, $(5t^2+12t+7)/4$ for $-1 \leq t < -1/2$, $(-7t^2+4)/4$ for $-1/2 \leq t < 1/2$, $(5t^2-12t+7)/4$ for $1/2 \leq t < 1$, $(3t^2-8t+5)/4$ for $1 \leq t < 3/2$, and $(-t^2+4t-4)/4$ for $3/2 \leq t \leq 2$ Or a step function waveform corresponding to such a sampling function may consist of eight piece wise sections in equal width with a weight of −1, +3, +5, −7, −7, +5, +3, and −1 in a predetermined range corresponding to five digital data arranged at an equal interval.

In this way, the use of a sampling function differentiable only once over the whole range, the number of integrating operation after synthesizing a plurality of a step function waveforms can be decreased, and the amount of calculation can be reduced. Also, because of the use of a sampling function having values of a local support, it is possible to handle only digital data corresponding to a section for the local support, so that the amount of calculation can be further reduced. Moreover, it is possible to prevent the truncation error from arising when the process is performed for the finite number of digital data.

DETAILED DESCRIPTION OF THE PREFERRED EMBODIMENT

A D/A converter according to one embodiment of the invention has a feature of generating continuously an analog signal waveform corresponding to a step function, making a convolution operation, and passing a stepwise analog waveform obtained consequently through an integration circuit to get an analog signal for interpolating continuously between the input discrete digital data, rather than passing through a sample hold circuit and a low-pass filter after oversampling using a digital filter to get an analog signal. The D/A converter according to an embodiment of the present invention will be described below with reference to the drawings.

Figure 1:
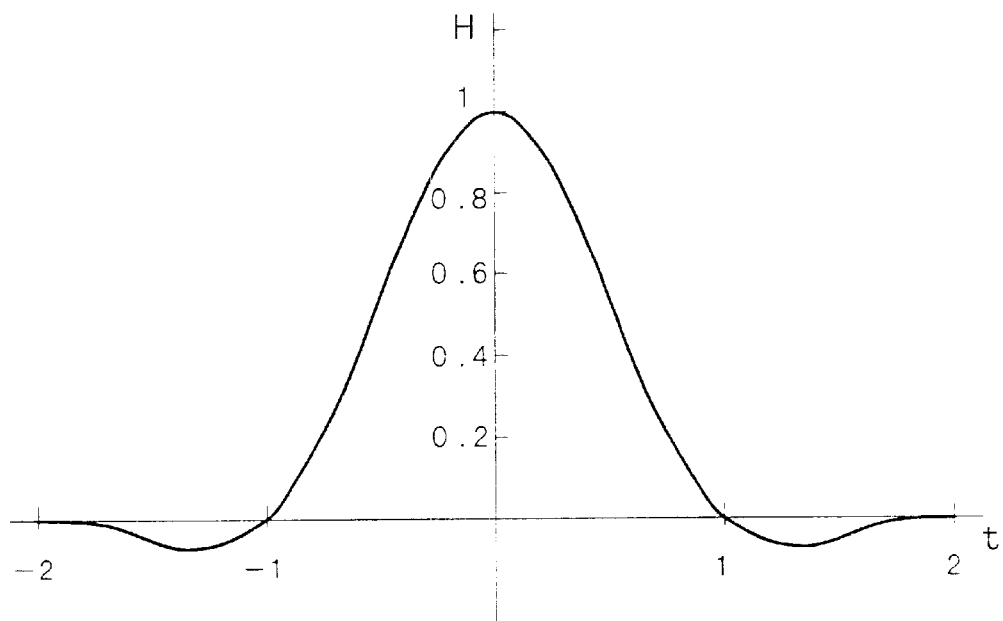
FIG. 1 is an explanatory graph of a sampling function used for an interpolating operation of a D/A converter according to an embodiment.

FIG. 1 is an explanatory graph of a sampling function used for an interpolating operation of a D/A converter according to an embodiment. A sampling function H(t) shown in FIG. 1 is a function of a local support to which attention is paid on differentiability. For example, the function H(t) can be differentiated only once in the whole region and a function of a local support having finite values, which are not zeroes, when a sample position along a horizontal axis is between −2 and +2. In addition, since being a sampling function, the function H(t) is characterized in that the function H(t) becomes one only at a sample point with t=0 and becomes zero at sample points with t=±1 and ±2.

It is verified by the present inventor's investigation that a function H(t) fulfilling various conditions described above (a sampling function, one-time differentiability, and a local support) exists. concretely, with letting a third order B spline function be F(t), such a sampling function H(t) can be defined as:

$$H(t) = -F(t+1/2)/4 + F(t) - F(t-1/2)/4 \qquad (1)$$

where F(t) is a third order B spline function.

Here, the third order B spline function F(t) is expressed as:

$$(4t^2+12t+9)/4;\ -3/2 \leq t < -1/2\ -2t^2+3/2;\ -1/2 \leq t < 1/2\ (4t^2-12t+9)/4;\ 1/2 \leq t < 3/2 \qquad (2)$$

The above-described sampling function H(t) is a quadric piecewise polynomial, and uses the third order B spline function F(t). Therefore, the function H(t) is a function of a local support that is guaranteed to be differentiable only once over the whole region. In addition, the function H(t) becomes zero at t=±1 and ±2.

Substituting the expression (2) into (1), the sampling function H(t) is represented in the form of a piecewise polynomial such that:

$(-t^2-4t-4)/4;\ -2 \leq t < -3/2$ $(3t^2+8t+5)/4;\ -3/2 \leq t < -1$ $(5t^2+12t+7)/4;\ -1 \leq t < -1/2$ $(-7t^2+4)/4;\ -1/2 \leq t < 1/2$ $(5t^2-12t+7)/4; \quad 1/2 \leq t < 1$ $(3t^2-8t+5)/4; \quad 1 \leq t < 3/2$ $(-t^2+4t-4)/4; \quad 3/2 \leq t \leq 2$ \hfill (3)

In this manner, the above-described function H(t) is a sampling function and a function of a local support that can be differentiated only once over the whole region and converges to zero at sample point t=±2. Therefore, it is possible to perform interpolation of a value between sample values using a function, which is differentiable only once, by performing convolution on the basis of respective sample value using this sampling function H(t).

Figure 2:
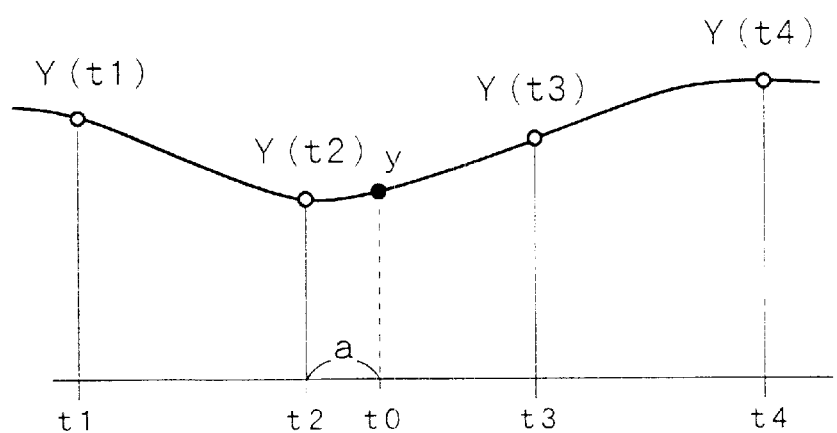
FIG. 2 is a graph showing a relation of the sampled values with an interpolated value between them.

FIG. 2 shows the relationship between sample value and interpolation values between the sample values. Generally, to obtain an interpolation value y corresponding to intermediate position between each sample value, the value of a sampling function is obtained for each piece of the given sample. value at the position of the interpolation value, and a convolution operation is performed using the obtained value.

In order to obtain the interpolation value y accurately, since the sinc function conventionally used converges to zero at sample points t=±∞, it is necessary to calculate a value of the sinc function at a position of the interpolation according to each sample value between t=±∞ and performing convolution operation using these values. Nevertheless, since the sampling function H(t) used in this embodiment converges to zero at sample points with t=±2, it is sufficient to consider each two sample values before and after an interpolation point. Therefore, it is possible to drastically reduce operation quantity. In addition, since it is theoretically unnecessary to consider sample value except that without disregarding the sample value in consideration of operation quantity, accuracy, and the like although the sample value should be considered, no truncation error arises.

FIGS. 3A to 3D are graphs for explaining the data interpolation using the sampling function shown in FIG. 1. Hereinafter, for examples, the sample value Y(t1) at the sample position t1 shown in FIG. 3A will be described concretely. The distance from an interpolation point t0 to a sampling position t1 becomes equal to 1±a, when the distance between two adjacent sampling positions is normalized at 1. Accordingly, when the central position of the sampling function H(t) is aligned to the sampling position t1, the value of the sampling function at interpolation point to becomes equal to H(1+a). Practically, since the peak height of the center position of the sampling function H(t) is adjusted so that the peak height may coincide with the sample value Y(t1), a value to be obtained becomes a value H(1+a)·Y(t1) obtained by multiplying the above-described function value H(1+a) by Y(t1).

Figure 3:
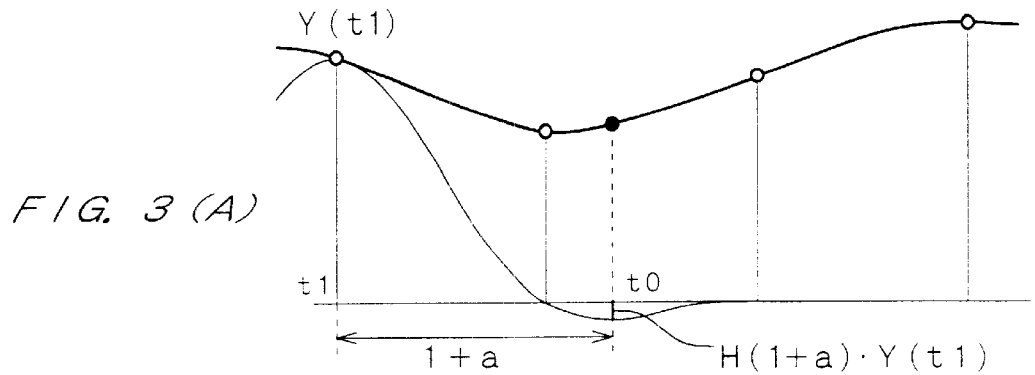
FIGS. 3A to 3D are graphs for explaining the data interpolation using the sampling function shown in FIG. 1.
Figure 3:
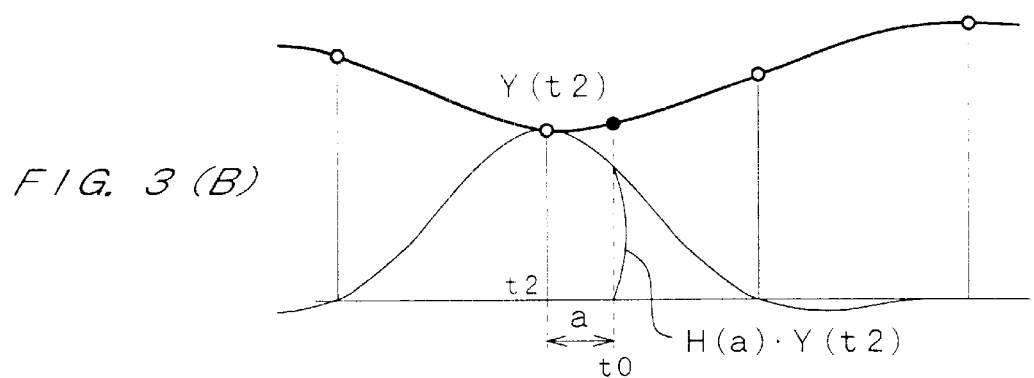
Figure 3:
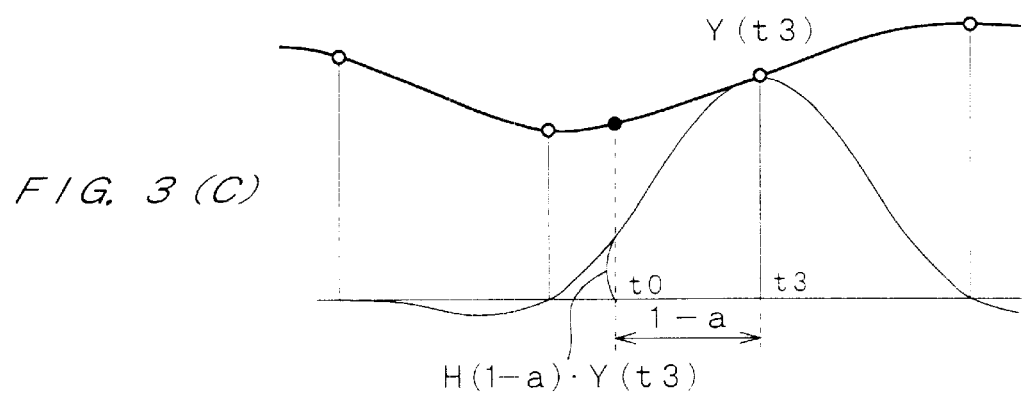
Figure 3:
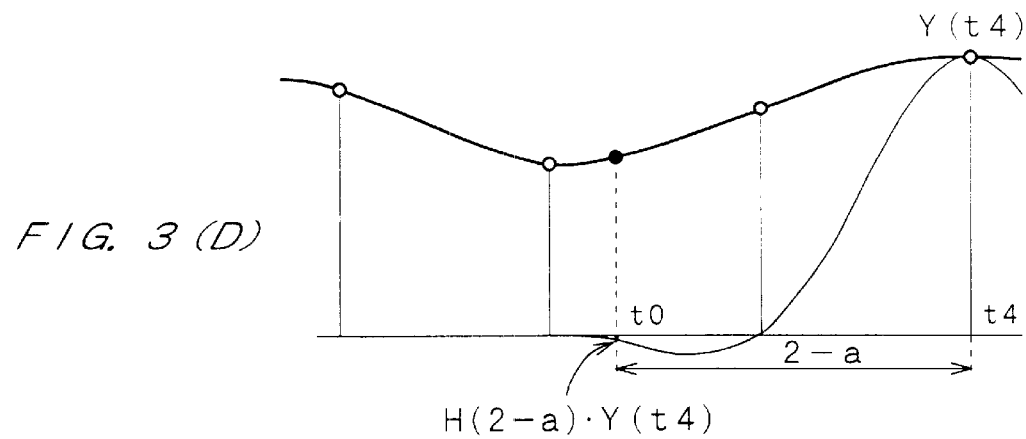

In the same way, the calculated results H(a)·Y(t2), H(1−a)·Y(t3), and H(2−a)·Y(t4) corresponding to other three sample values are obtained at interpolation position t0, as shown in FIGS. 3B to 3D. Then, four calculated results H(1+a)·Y(t1), H(a)·Y(t2), H(1−a)·Y(t3), and H(2−a)·Y(t4) are added, and convoluted to get an interpolated value y at interpolation point t0.

In principle, the value of the sampling function H(t) is calculated in correspondence to each sample value, and convoluted, so that an interpolated value corresponding to an intermediate position between the sample values can be obtained, as described above. However, the sampling function of FIG. 1 is a quadratic piecewise polynomial that is differentiable once over the whole region. Using this feature, the interpolated value can be obtained in accordance with other equivalent processing procedures.

Figure 4:
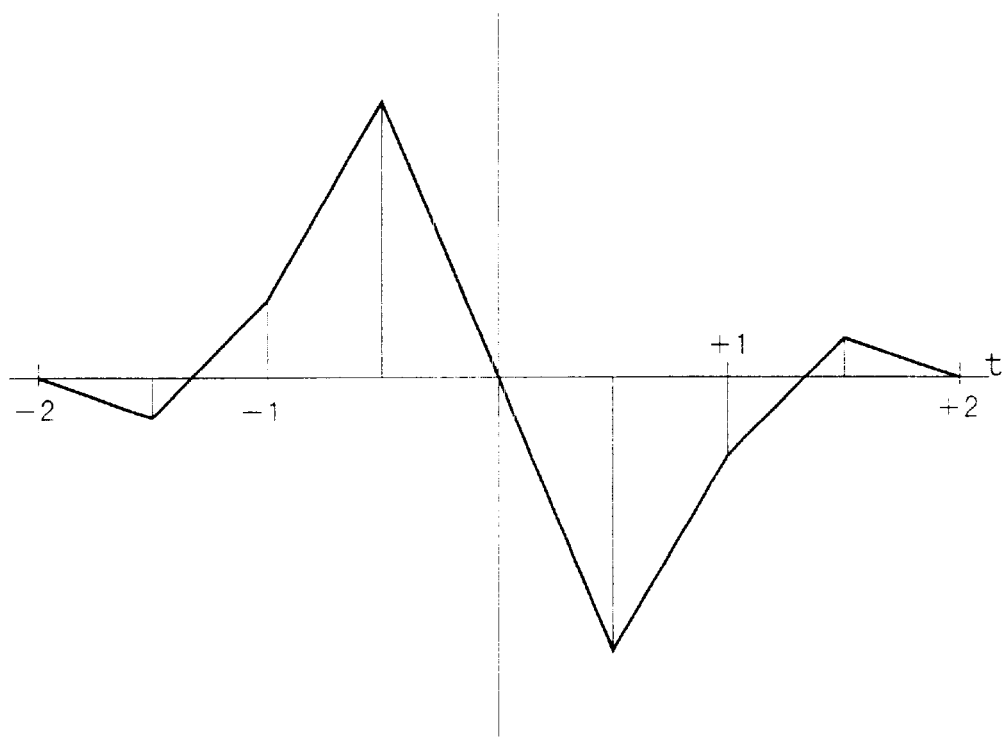
FIG. 4 is a graph showing a waveform in which the sampling function shown in FIG. 1 is differentiated once.

FIG. 4 is a graph representing a waveform where the sampling function of FIG. 1 is differentiated once. Since the sampling function H(t) of FIG. 1 is a quadratic piecewise polynomial that is differentiable only once over the whole region, a polygonal function consisting of continuous polygonal waveforms as shown in FIG. 4 can be obtained by differentiating the sampling function H(t) once.

Figure 5:
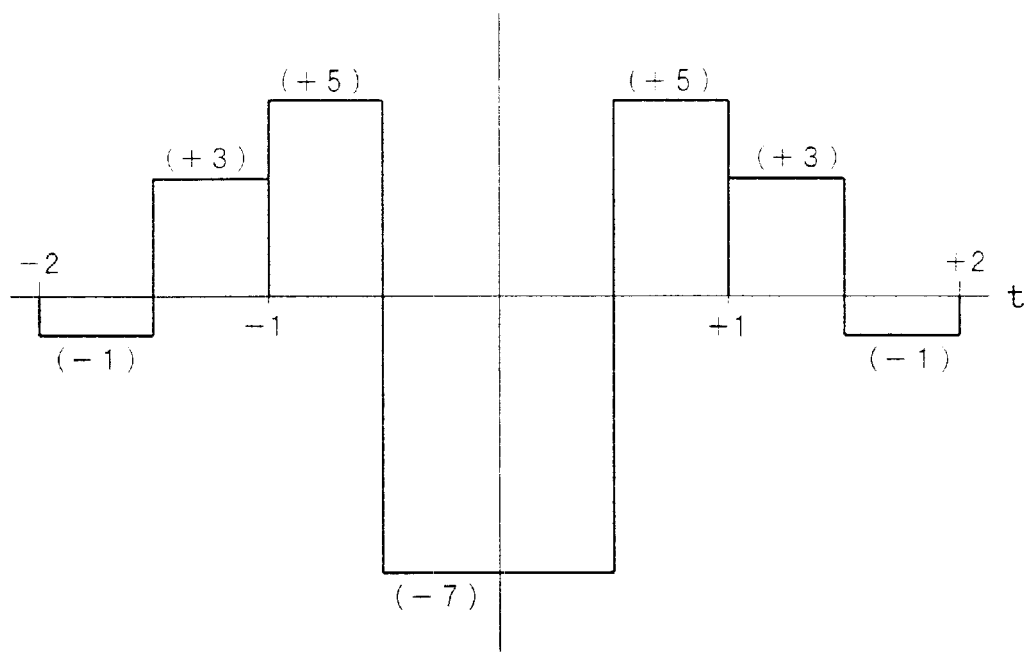
FIG. 5 is a graph showing a waveform in which a polygonal function shown in FIG. 4 is further differentiated.

FIG. 5 is a graph representing a waveform where the polygonal function of FIG. 4 is further differentiated. However, the polygonal waveform, containing a plurality of corner points, cannot be differentiated over the entire region, and is differentiated for a linear section between two adjacent corner points. By differentiating the polygonal waveform shown in FIG. 4, a step function consisting of staircase waveforms can be obtained, as shown in FIG. 5.

In this way, the sampling function for use with the interpolation operation in the D/A converter of this embodiment is differentiated once over the whole region to get a polygonal function. Further, this polygonal function is differentiated over each linear section to get a step function. Accordingly, in reverse order, the step function of FIG. 5 is generated and integrated twice, so that a sampling function H(t) of FIG. 1 can be obtained.

The step function as shown in FIG. 5 has a feature of having an equal area in the positive region and the negative region, in which the sum of area is zero. In other words, if the step function having such feature is integrated by multiple times, a sampling function of a local support that is assured to be differentiable over the entire region can be obtained, as shown in FIG. 1.

By the way, in calculating the interpolated value by the use of convolution operation shown in FIGS. 3A to 3D, the value of the sampling function H(t) is multiplied by each sample value. However, in the case where the step function as shown in FIG. 5 is integrated twice to get a sampling function H(t), the value of the sampling function obtained by this integration is multiplied by each sample value, but equivalently, in generating a step function before the integral operations, the step function may be multiplied by each sampled value, and then convoluted, and the thus-obtained result integrated twice to, get an interpolated value. The D/A converter of this embodiment calculates the interpolated value in this way, and will be detailed below.

Figure 6:
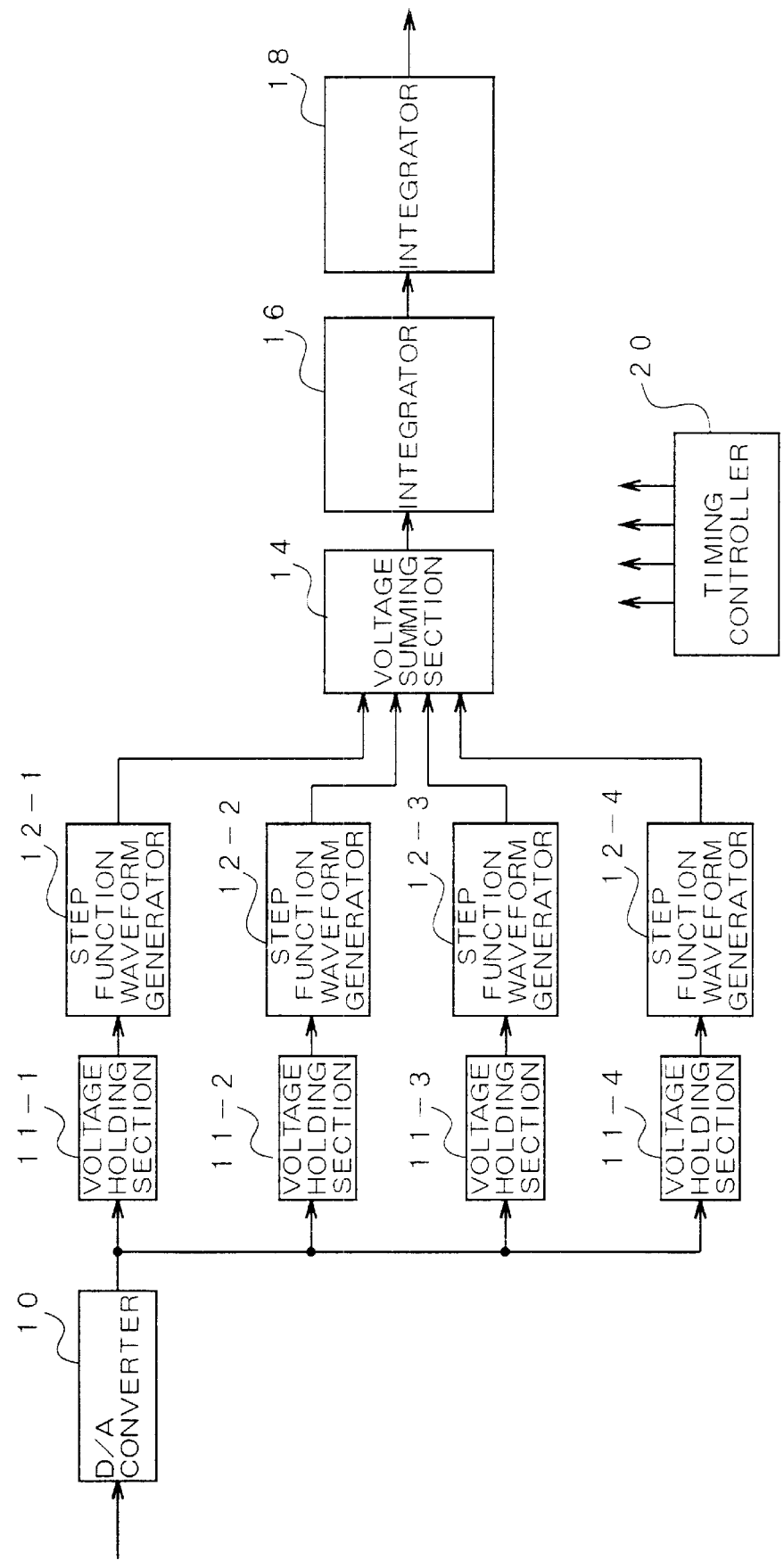
FIG. 6 is a block diagram showing the configuration of a D/A converter of an embodiment.

FIG. 6 is a diagram showing a configuration of the D/A converter of this embodiment. The D/A converter shown in FIG. 6 comprises a D/A converter 10, four voltage holding sections 11-1, 11-2, 11-3, 11-4, four step function waveform generators 12-1, 12-2, 12-3, 12-4, a voltage summing section 14, two integrators 16, 18, and a timing controller 20.

The D/A converter 10 produces an analog voltage on the basis of discrete digital data input successively at a predetermined time interval. This D/A converter 10 produces a constant analog voltage in proportion to the input value of digital data, so that a discrete pulsed output voltage corresponding to the input digital data can be obtained.

The voltage holding sections 11-1 to 11-4 accept cyclically a pulsed output voltage appearing at an output end of the D/A converter 10 at a predetermined timing, and hold its voltage value till the next accept timing has arrived. For example, a pulsed output voltage first output from the D/A converter 10 is held in a voltage holding section 11-1; a pulsed output voltage secondly output from the D/A converter 10 is held in a voltage holding section 11-2; a pulsed output voltage thirdly output from the D/A converter 10 is held in a voltage holding section 11-3; and a pulsed output voltage fourthly output from the D/A converter 10 is held in a voltage holding section 11-4. If the holding operation of voltage in each of the voltage holding sections 11-1 to 11-4 is circulated, a fifth pulsed output voltage output subsequently from the D/A converter 10 is accepted and held in the voltage holding section 11-1 that has a longest voltage holding time. In this way, the voltage corresponding to each digital data input successively is held cyclically in the data holding sections 11-1 to 11-4.

The step function waveform generators 12-1 to 12-4 generate a step function waveform having a voltage level proportional to the magnitude of holding voltage in synchronization with the timing of voltage holding operation by the corresponding voltage holding sections 11-1 to 1-4. The step function waveform has a shape as shown in FIG. 5. The voltage level of this step function waveform is proportional to the voltage value held in each of the voltage holding sections 11-1 to 11-4. Specific values of the step function shown in FIG. 5 can be acquired by differentiating each piecewise polynomial of the above expression (3) twice and represented as follows.

$-1; -2 \leq t < -3/2$ $3; -3/2 \leq t < -1$ $5; -1 \leq t < -1/2$ $-7; -1/2 \leq t < 0$ $-7; 0 \leq t < 1/2$ $5; 1/2 \leq t < 1$ $3; 1 \leq t < 3/2$ $-1; 3/2 \leq t \leq 2$ These values correspond to the weighting factors when a synthesis process of voltage is performed in the voltage summing section 14 that follows, and will be detailed later.

The voltage summing section 14 synthesizes each output voltages of four step function waveform generators 12-1 to 12-4 in analog manner. Two integrators 16, 18 connected in tandem perform two integral operations for a stepwise changing output voltage appearing at the output end of the voltage summing section 14. A linearly changing (like a linear function) output value is obtained from a former integrator 16, and an output value changing like a quadratic function is obtained from a latter integrator 18. In this way, if plural digital data are input at a constant interval, a latter integrator 18 outputs a continuous analog signal with a smooth curve differentiable only once connecting the voltages corresponding to each digital data.

By the way, a step function waveform to be output from the step function waveform generator 12-1 has a voltage level proportional to a voltage (corresponding to the input digital data) held in the voltage holding section 11-1. Therefore, this step function waveform is integrated twice by two integrators 16, 18, so that a signal having a waveform corresponding to the result of multiplication between the step function of FIG. 1 and the input digital data is output from the latter integrator 18. Also, the voltage summing section 14 combines the voltage with a step function waveform output from each of the step function waveform generators 12-1 to 12-4. This is equivalent to a process of adding up the values of the step functions. Hence, a resultant voltage corresponding to this result of addition is output from the voltage summing section 14.

Accordingly, considering the case where the digital data is input at a constant time interval, the start timing of generating the step function waveform in each of the step function waveform generators 12-1 to 12-4 is shifted corresponding to this input interval. Then, the voltages are synthesized using the step function waveforms generated in the step function waveform generators 12-1 to 12-4, and integrated twice to get an analog signal smoothly connecting the voltages corresponding to the digital data.

Figure 7:
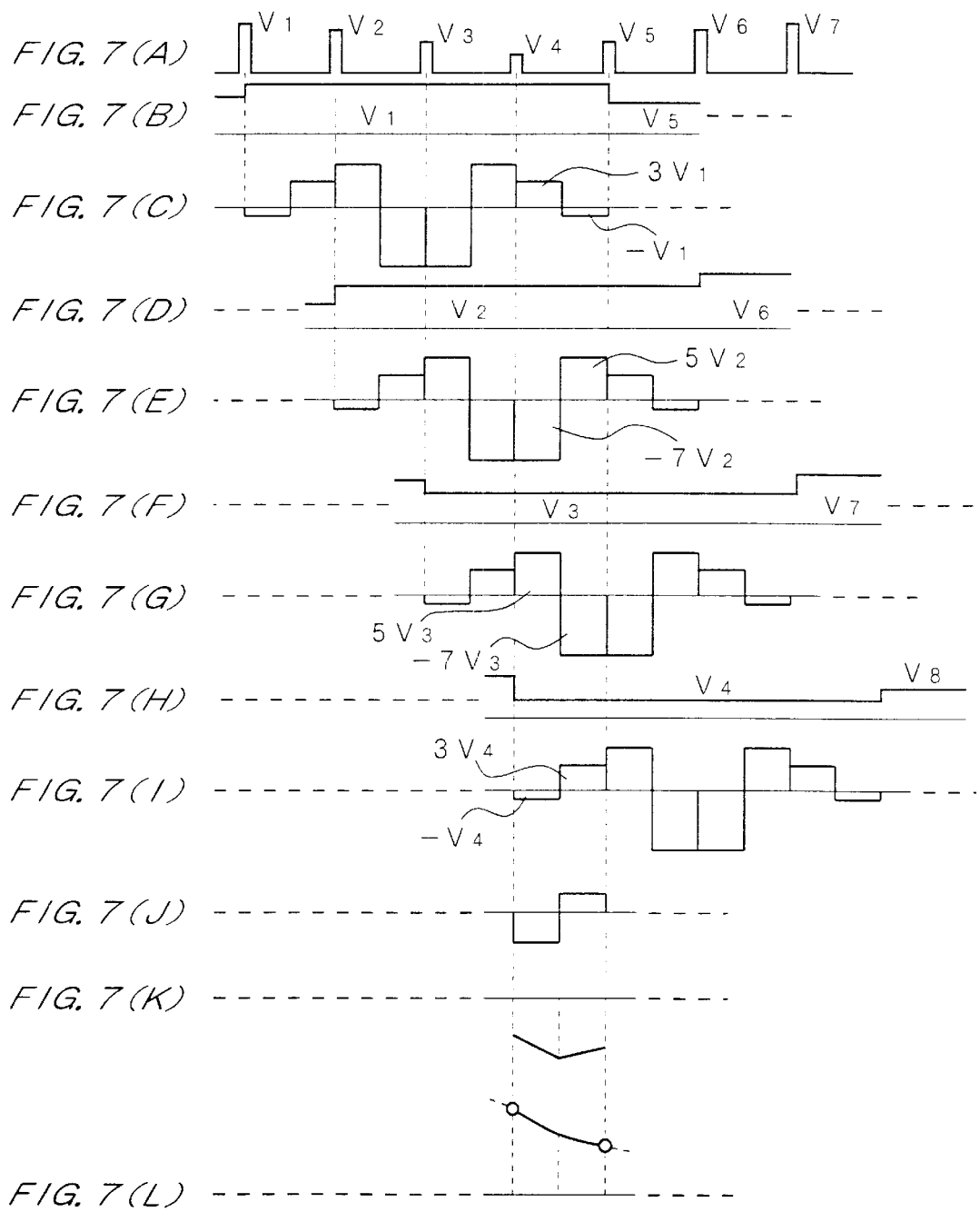
FIGS. 7A to 7L are charts showing the operation timings of the D/A converter of an embodiment.

FIGS. 7A to 7L are charts showing the operation timings of the D/A converter in this embodiment. As shown in FIG. 7A, if the digital data is input at a constant time interval, the D/A converter 10 generates a pulsed analog voltage $V_1$, $V_2$, $V_3$, . . . in accordance with the value of each digital data. Each of the voltage holding sections 11-1 to 11-4 accepts and holds cyclically the pulsed voltage $V_1$, $V_2$, $V_3$, . . . generated in this way. More specifically, the voltage holding section 11-1 accepts a pulsed voltage $V_1$ generated at first, and holds the pulsed voltage $V_1$ till the output voltage of the D/A converter 10 is circulated (or till a fifth pulsed voltage $V_5$ is generated) (FIG. 7B). The step function waveform generator 12-1 generates a step function waveform having a voltage level proportional to this voltage $V_1$ in accordance with the hold timing of the first pulsed voltage $V_1$ (FIG. 7C).

Similarly, the voltage holding section 11-2 accepts a pulsed voltage $V_2$ generated secondly and holds the pulsed voltage $V_2$ till the output voltage of the D/A converter 10 is circulated (or a sixth pulsed voltage $V_6$ appears) (FIG. 7D). The step function waveform generator 12-2 generates a step function waveform having a voltage level proportional to this voltage $V_2$ in accordance with the hold timing of the second pulsed voltage $V_2$ (FIG. 7E).

The voltage holding section 11-3 accepts a pulsed voltage $V_3$ generated thirdly and holds the pulsed voltage $V_3$ till the output voltage of the D/A converter 10 is circulated (or a seventh pulsed voltage $V_7$ appears) (FIG. 7F). The step function waveform generator 12-3 generates a step function waveform having a voltage level proportional to this voltage $V_3$ in accordance with the hold timing of the third pulsed voltage $V_3$ (FIG. 7G).

The voltage holding section 11-4 accepts a pulsed voltage $V_4$ generated fourthly and holds the pulsed voltage $V_4$ till the output voltage of the D/A converter 10 is circulated (or an eighth pulsed voltage $V_8$ appears) (FIG. 7H). The step function waveform generator 12-4 generates a step function waveform having a voltage level proportional to this voltage $V_4$ in accordance with the hold timing of the fourth pulsed voltage $V_4$ (FIG. 7I).

The voltage summing section 14 combines a step function waveform (analog voltage) generated in each of four step function waveform generators 12-1 to 12-4 in this way to equivalently add up four step function waveforms (FIG. 7J). Since four step function waveforms are added, this summation results in a simple step function waveform.

By the way, the step function waveform generated by each of the step function waveform generators 12-1 to 12-4 as shown in FIG. 5 is a function of a local support having eight piecewise sections divided at every 0.5 from a region of the sample point t=−2 to +2 in which the sampling function of FIG. 1 has finite values. For example, a first piecewise section, a second piecewise section, . . . , and an eighth piecewise section are defined in a direction from the sample point t=−2 to +2.

More specifically, the voltage summing section 14 at first combines a voltage ($3V_1$) corresponding to the seventh piecewise section that is generated by the step function waveform generator 12-1, a voltage ($-7V_2$) corresponding to the fifth piecewise section that is generated by the step function waveform generator 12-2, a voltage ($5V_3$) corresponding to the third piecewise section that is generated by the step function waveform generator 12-3, and a voltage $(-V_4)$ corresponding to the first piecewise section that is generated by the step function waveform generator 12-4 to produce a resultant voltage corresponding to a summation $(3V_1 -7V_2 +5V_3 -V_4)$ of the voltage values.

Then, the voltage summing section 14 combines a voltage $(-V_1)$ corresponding to the eighth piecewise section that is generated by the step function waveform generator 12-1, a voltage $(5V_2)$ corresponding to the sixth piecewise section that is generated by the step function waveform generator 12-2, a voltage $(-7V_3)$ corresponding to the fourth piecewise section that is generated by the step function waveform generator 12-3, and a voltage $(3V_4)$ corresponding to the second piecewise section that is generated by the step function waveform generator 12-4 to produce a resultant voltage corresponding to a summation $(-V_1 +5V_2 -7V_3 +3V_4)$ of the voltage values.

In this way, if the stepwise voltage level waveform is output from the voltage summing section 14, the former integrator 16 integrates the waveform to output a polygonal waveform (FIG. 7K). The latter integrator 18 further integrates the polygonal waveform to produce an output voltage with a smooth curve differentiable only once connecting the voltage values corresponding to the digital data $D_2$ and $D_3$ (FIG. 7L).

In this way, the D/A converter of this embodiment generates a step function waveform in accordance with the holding timing of the voltage corresponding to input digital data, combines this step function waveform for each of four digital data, and integrates a resultant waveform twice to get a continuous analog signal connecting smoothly the voltages corresponding to the digital data.

In particular, four step function waveforms are generated corresponding to the input digital data at different start timings, these voltages are combined, and integrated twice to get a continuous analog signal. Hence, there is no need of preparing a sample hold circuit and a low pass filter that were conventionally required. There is no degradation in the linear phase characteristic, whereby the excellent group delay characteristic can be achieved. Since a sampling function H(t) of a local support which converges to zero at a sample point t=±2 is used, an interpolation process between digital data only uses four digital data, so that the amount of processing required for the interpolation can be diminished. Further, since the oversampling process as conventionally performed is not conducted, it is only necessary to assure a predetermined operation speed that is determined depending on the time interval of input digital data, and there is no need of effecting particularly fast signal processing and using expensive parts.

Figure 8:
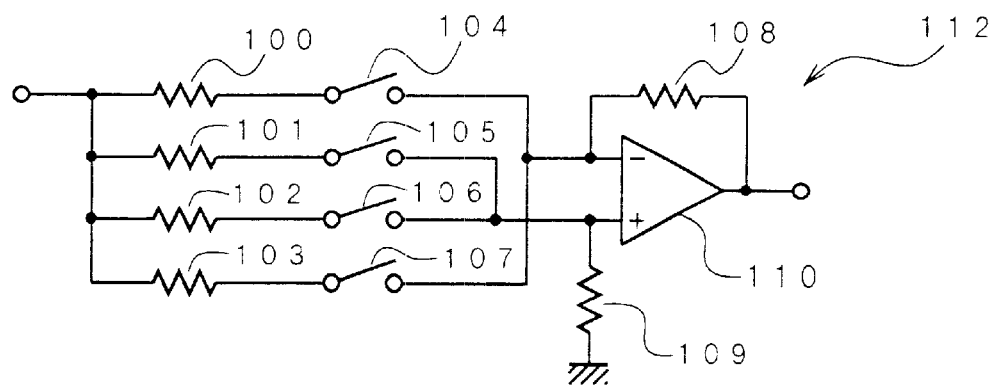
FIG. 8 is a diagram showing a basic configuration of a step function wave form generator for generating a step function waveform shown in FIG. 5.

A specific configuration of the D/A converter will be described below. FIG. 8 is a diagram showing a basic configuration of a step function waveform generator for generating a step function waveform as shown in FIG. 5. The step function waveform generator 112 shown in FIG. 8 comprises two resistors 108, 109 and an operational amplifier 110 making up an amplifier to effect the inverted or non-inverted amplification, resistors 100, 103 and switches 104, 107 connected to a inverted input terminal side of the operational amplifier 110, and resistors 101, 102 and switches 105, 106 connected to a non-inverted input terminal side of the operational amplifier 110. Four resistors 100 to 103 connected to the input terminal sides of the operational amplifier 110 are set to the resistance values R, R/3, R/5, and R/7, respectively.

Figure 9:
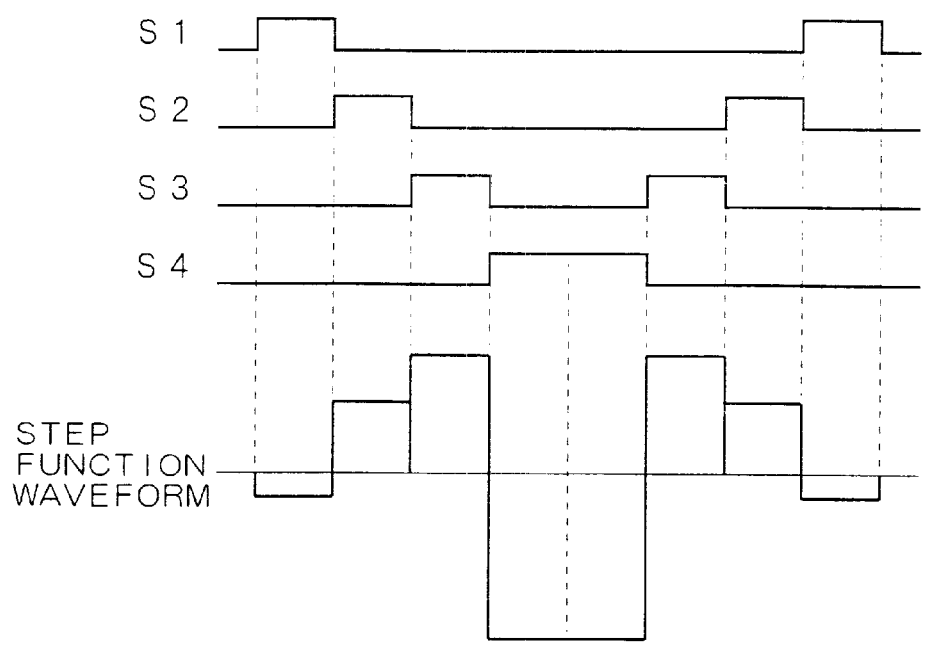
FIG. 9 is a diagram showing the relation between the step function waveform generated by the step function waveform generator shown in FIG. 8 and the ON/OFF switching timings of each switch.

FIG. 9 is a chart representing the relation between the step function waveform generated by the step function waveform generator 112 as shown in FIG. 8 and the ON/OFF switching timing of each switch. In FIG. 9, S1, S2, S3 and S4 indicate the ON/OFF state of the switches 104 to 107 connected in series with the resistors 100 to 103, respectively.

As shown in FIG. 9, in the case where a voltage corresponding to the first and eighth piecewise sections of the step function waveform is generated by the step function waveform generator 112, a switch 104 interposed between the inverted input terminal of the operational amplifier 110 and a resistor 100 with a resistance value R is turned on. Similarly, in the case where a voltage corresponding to the second and seventh piecewise sections of the step function waveform is generated by the step function waveform generator 112, a switch 105 interposed between the non-inverted input terminal of the operational amplifier 110 and a resistor 101 with a resistance value R/3 is turned on. In the case where a voltage corresponding to the third and sixth piecewise sections of the step function waveform is generated by the step function waveform generator 112, a switch 106 interposed between the non-inverted input terminal of the operational amplifier 110 and a resistor 102 with a resistance value R/5 is turned on. And in the case where a voltage corresponding to the fourth and fifth piecewise sections of the step function waveform is generated by the step function waveform generator 112, a switch 107 interposed between the inverted input terminal of the operational amplifier 110 and a resistor 104 with a resistance value R/7 is turned on.

By the way, it is required for the step function waveform generator 112 shown in FIG. 8 to have a switching state for each of the four switches 104 to 107 set, which have the four resistors 100 to 103 connected to the input side of the operational amplifier 110, but the number of switches for control can be reduced by altering the circuit configuration.

Figure 10:
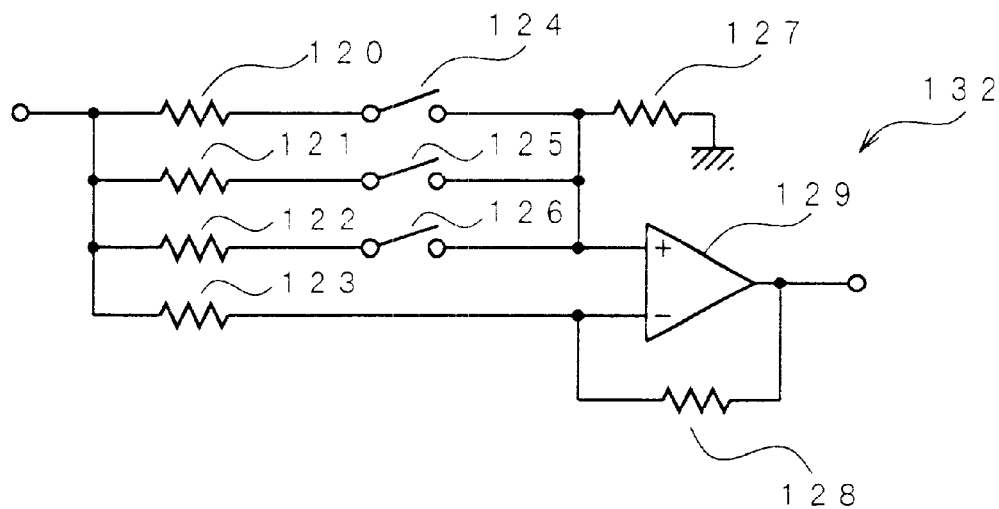
FIG. 10 is a diagram showing a modified configuration of the step function waveform generator.

FIG. 10 is a diagram showing a modified configuration of the step function waveform generator. A step function waveform generator 132 shown in FIG. 10 comprises two resistors 127, 128 and an operational amplifier 129 making up a differential amplifier, resistors 120, 121, 122 and switches 124, 125, 126 connected to a non-inverted input terminal side of the operational amplifier 129, and a resistor 123 connected to a inverted input terminal of the operational amplifier 129. Three resistors 120 to 122 connected to the non-inverted input terminal side of the operational amplifier 129 are set to the resistance values R/6, R/10 and R/12, respectively. Also, the resistor 123 connected to the inverted input terminal of the operational amplifier 129 is set to a resistance value R/7.

Figure 11:
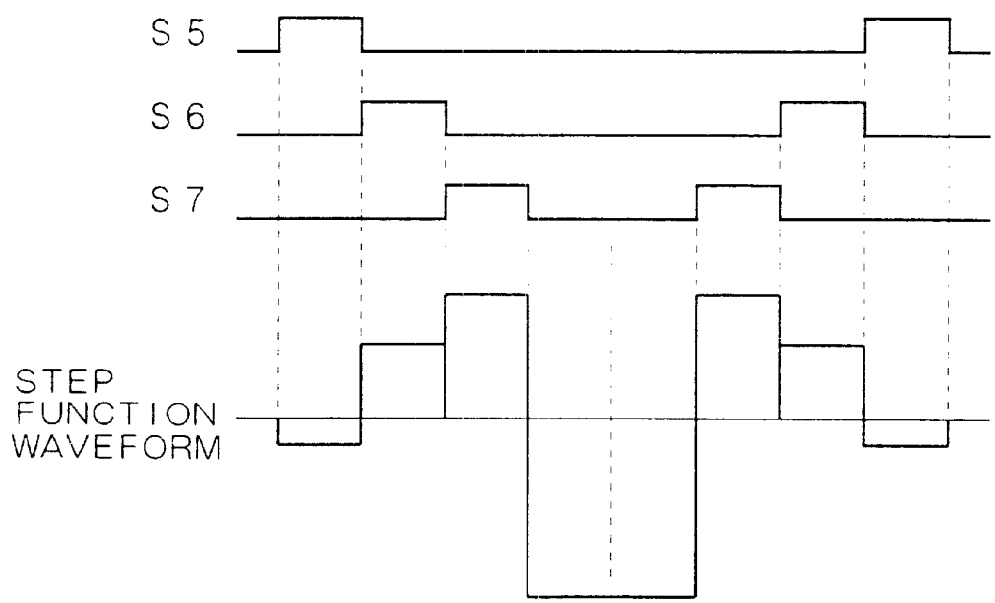
FIG. 11 is a diagram showing the relation between the step function waveform generated by the step function waveform generator shown in FIG. 10 and the ON/OFF switching timings of each switch.

FIG. 11 is a chart representing the relation between the step function waveform generated by the step function waveform generator 132 shown in FIG. 10 and the ON/OFF switching timing of each switch. In FIG. 11, S5, S6, and S7 indicate the ON/OFF state of the switches 124 to 126 connected in series with the resistors 120 to 122, respectively.

As shown in FIG. 11, in the case where a voltage corresponding to the first and eighth piecewise sections for the step function waveform is generated by the step function waveform generator 132, a switch 124 interposed between the non-inverted input terminal of the operational amplifier 129 and a resistor 120 is turned on. In this state, when a predetermined input voltage is applied, a voltage across the resistor 120 having a resistance value R/6 is applied to the non-inverted input terminal of the operational amplifier 129, while at the same time a voltage across a resistor 123 having a resistance value R/7 is applied to the inverted input terminal of the operational amplifier 129. Thus, since the operational amplifier 129 operates as a differential amplifier, a voltage proportional to a difference between the voltages applied to these two input terminals appears at an output terminal of the operational amplifier 129.

Similarly, in the case where a voltage corresponding to the second and seventh piecewise sections for the step function waveform is generated by the step function waveform generator 122, a switch 125 interposed between the non-inverted input terminal of the operational amplifier 129 and a resistor 121 is turned on. In this state, when a predetermined input voltage is applied, a voltage across the resistor 121 having a resistance value R/10 is applied to the non-inverted input terminal of the operational amplifier 129, while at the same time a voltage across the resistor 123 having a resistance value R/7 is applied to the inverted input terminal of the operational amplifier 129. Thus, since the operational amplifier 129 operates as a differential amplifier, a voltage proportional to a difference between the voltages applied to these two input terminals appears at the output terminal of the operational amplifier 129.

In the case where a voltage corresponding to the third and sixth piecewise sections for the step function waveform is generated by the step function waveform generator 122, a switch 126 interposed between the non-inverted input terminal of the operational amplifier 129 and a resistor 122 is turned on. In this state, when a predetermined input voltage is applied, a voltage across the resistor 122 having a resistance value R/12 is applied to the non-inverted input terminal of the operational amplifier 129, while at the same time a voltage across the resistor 123 having a resistance value R/7 is applied to the inverted input terminal of the operational amplifier 129. Thus, since the operational amplifier 129 operates as a differential amplifier, a voltage proportional to a difference between the voltages applied to these two input terminals appears at the output terminal of the operational amplifier 129.

In the case where a voltage corresponding to the fourth and fifth piecewise sections for the step function waveform is generated by the step function waveform generator 122, all the three switches 124 to 126 corresponding to three resistors 120 to 122 connected to the non-inverted input terminal of the operational amplifier 129 are turned off. In this state, the non-inverted input terminal of the operational amplifier 129 is grounded via a resistor 127, and a predetermined input voltage is applied across the resistor 123 having a resistance value R/7 to the inverted input terminal of the operational amplifier 129, so that a voltage where the applied voltage is inverted and amplified appears at the output terminal of the operational amplifier 129.

Figure 12:
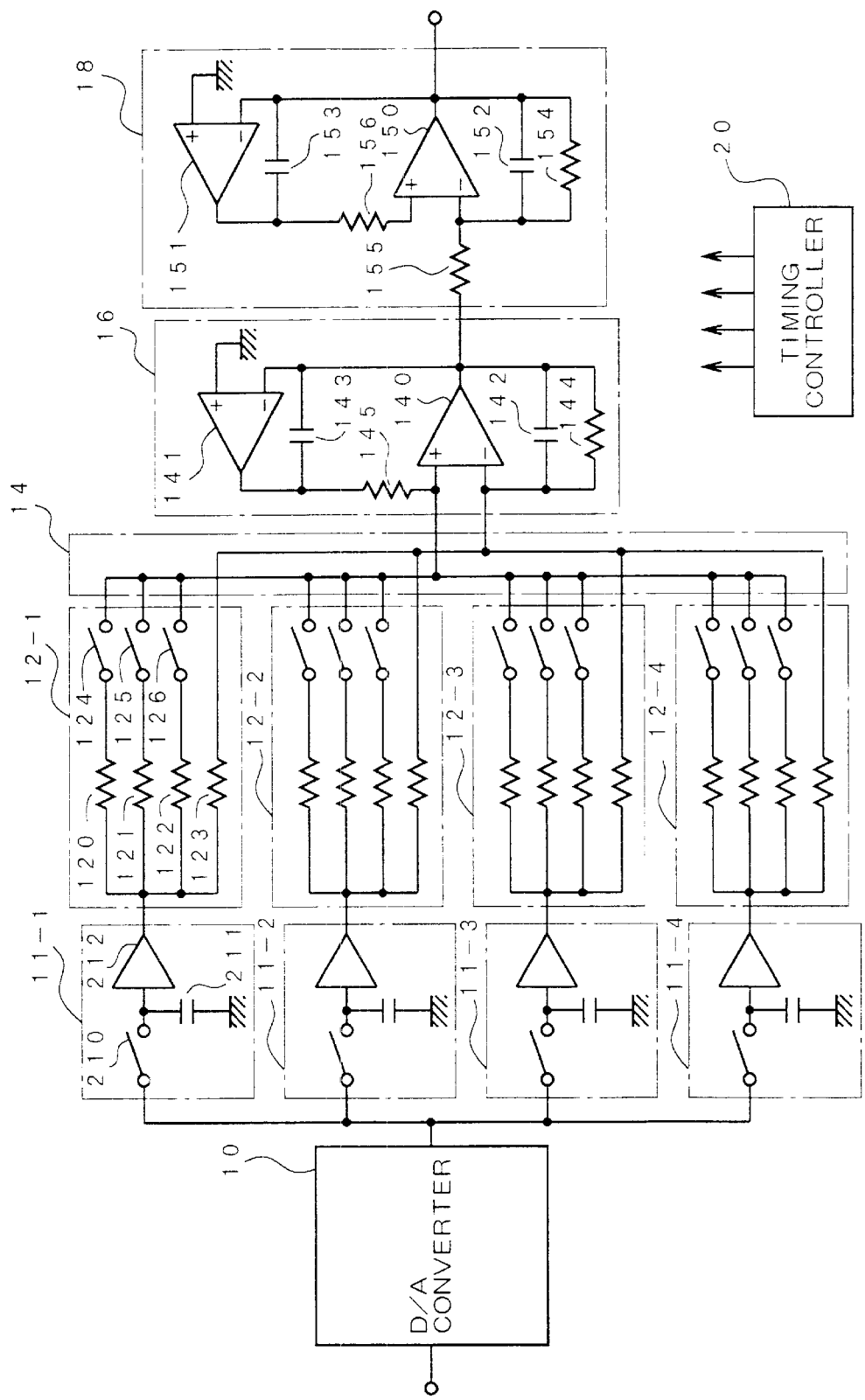
FIG. 12 is a diagram showing a detailed configuration of the D/A converter shown in FIG. 6.

FIG. 12 is a diagram showing a detailed configuration of the D/A converter as shown in FIG. 6. As shown in FIG. 12, each of the voltage holding sections 11-1 to 11-4 comprises a switch 210, a capacitor 211, and a buffer 212. For example, the switch 210 is turned on at a timing when an output voltage $V_1$ of the D/A converter 10 is applied to a voltage holding section 11-1, and the capacitor 211 is charged by this applied voltage $V_1$. Then, if the switch 210 is turned off, a voltage across the capacitor 211 is held, and a constant voltage corresponding to this voltage across the capacitor 211 is taken out as the output voltage of the buffer 212. Other voltage holding sections 11-2 to 11-4 apply in the same manner. The switch 210 is controlled to be turned on at a predetermined timing, so that a constant voltage corresponding to this applied voltage is held till the switch 210 is switched on at the next time.

Each of the step function waveform generators 12-1 to 12-4 comprises four resistors 120 to 123 and three switches 124 to 126 as shown in FIG. 12. These resistors and switches are the same as those of the step function waveform generator 132 shown in FIG. 10. Hence, each of the switches 124 to 126 is controlled to turn on or off at a timing indicated at S5, S6 and S7 in FIG. 11.

Also, the voltage summing section 14 is materialized by connecting one ends of three switches 124 to 126 contained in each of the step function waveform generators 12-1 to 12-4, and connecting one ends of the resistors 123 not connected to the switches 123 to 126, as shown in FIG. 12.

Figure 13:
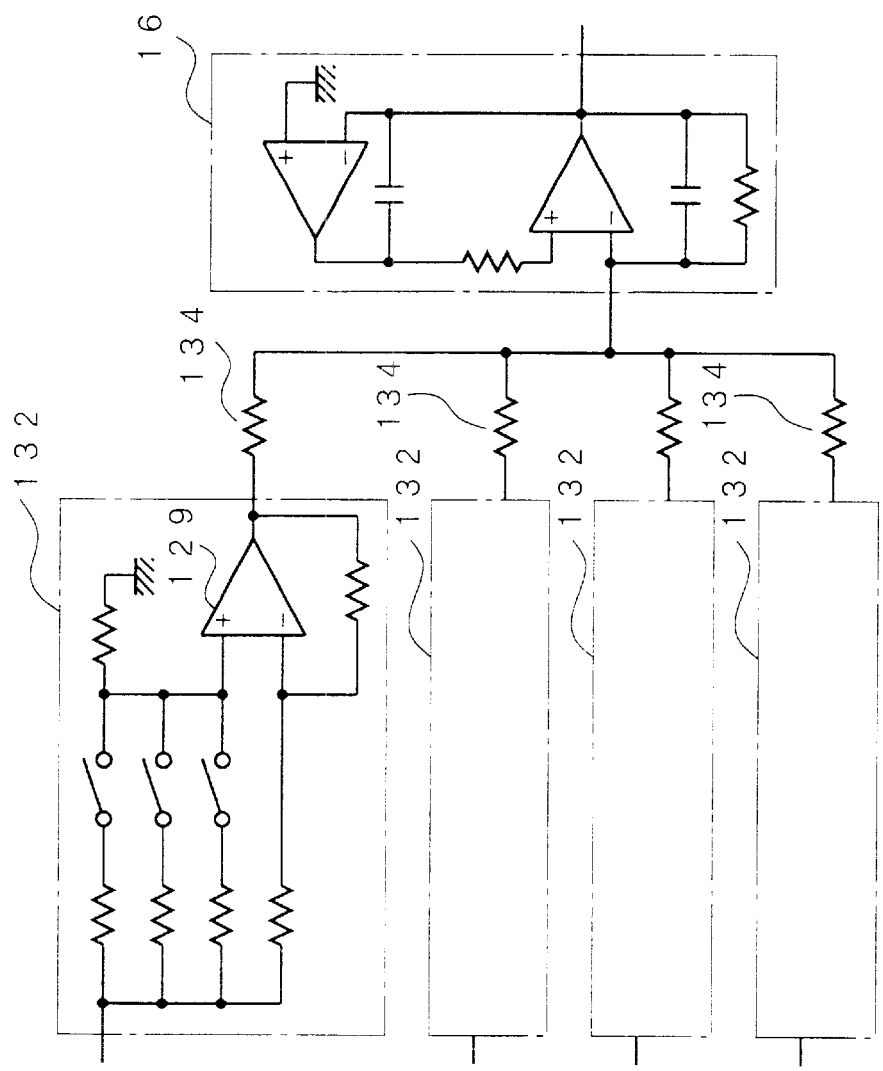
FIG. 13 is a diagram showing a partial configuration of the D/A converter using the step function waveform generator shown in FIG. 10.

By the way, in the case where the step function waveforms generated by the step function waveform generator 132 shown in FIG. 10 are synthesized, in principle, the step function waveforms are generated separately by a plurality of step function waveform generators 132, and the output ends of the operational amplifiers 129 are connected via the resistors 134, as shown in FIG. 13, whereby the voltages corresponding to respective waveforms can be synthesized. However, since an operational amplifier is contained in the integrator 16 in the D/A converter shown in FIG. 12, the operational amplifiers 129 within the step function waveform generators 132 and the resistors 134 connected to the output terminal of the operational amplifiers 129 can be omitted. Hence, in each of the step function waveform generators 12-1 to 12-4, the operational amplifier 129 is omitted, and in the voltage summing section 14, each resistor 134 is omitted.

Also, the former integrator 16 comprises two operational amplifiers 140, 141, two capacitors 142, 143, and two resistors 144, 145, as shown in FIG. 12. An integration circuit is configured by one operational amplifier 140, a capacitor 142 and a resistor 144, whereby a predetermined integral operation is performed based on a difference between the voltages applied to two input terminals (non-inverted and inverted input terminals) of the operational amplifier 140. Also, a zero-level holding circuit is configured by the other operational amplifier 141, a capacitor 143, and a resistor 145. Thus, the voltage level at the non-inverted input terminal of the operational amplifier 140 is adjusted so that the average value of the output from the integration circuit may be zero volt at any time. In particular, when the digital data input into the D/A converter is considered to be the data created by sampling an audio signal, the average value of the analog signal generated based on this data becomes zero volt. Hence, it is preferable to avoid the drift of output voltage in the integration circuit, using the zero-level holding circuit as described above.

The latter integrator 18, which has fundamentally the same configuration as the former integrator 16, comprises two operational amplifiers 150, 151, two capacitors 152, 153, and three resistors 154, 155, 156. An integration circuit is configured by one operational amplifier 150, a capacitor 152, and two resistors 154, 155, whereby a predetermined integral operation is performed for a voltage applied to the inverted input terminal of the operational amplifier 150. A zero-level holding circuit is configured by the other operational amplifier 151, a capacitor 153, and a resistor 156, whereby the voltage level at the non-inverted input terminal of the operational amplifier 150 is adjusted so that the average value of the output from the integration circuit may be zero volt at any time.

Figure 14:
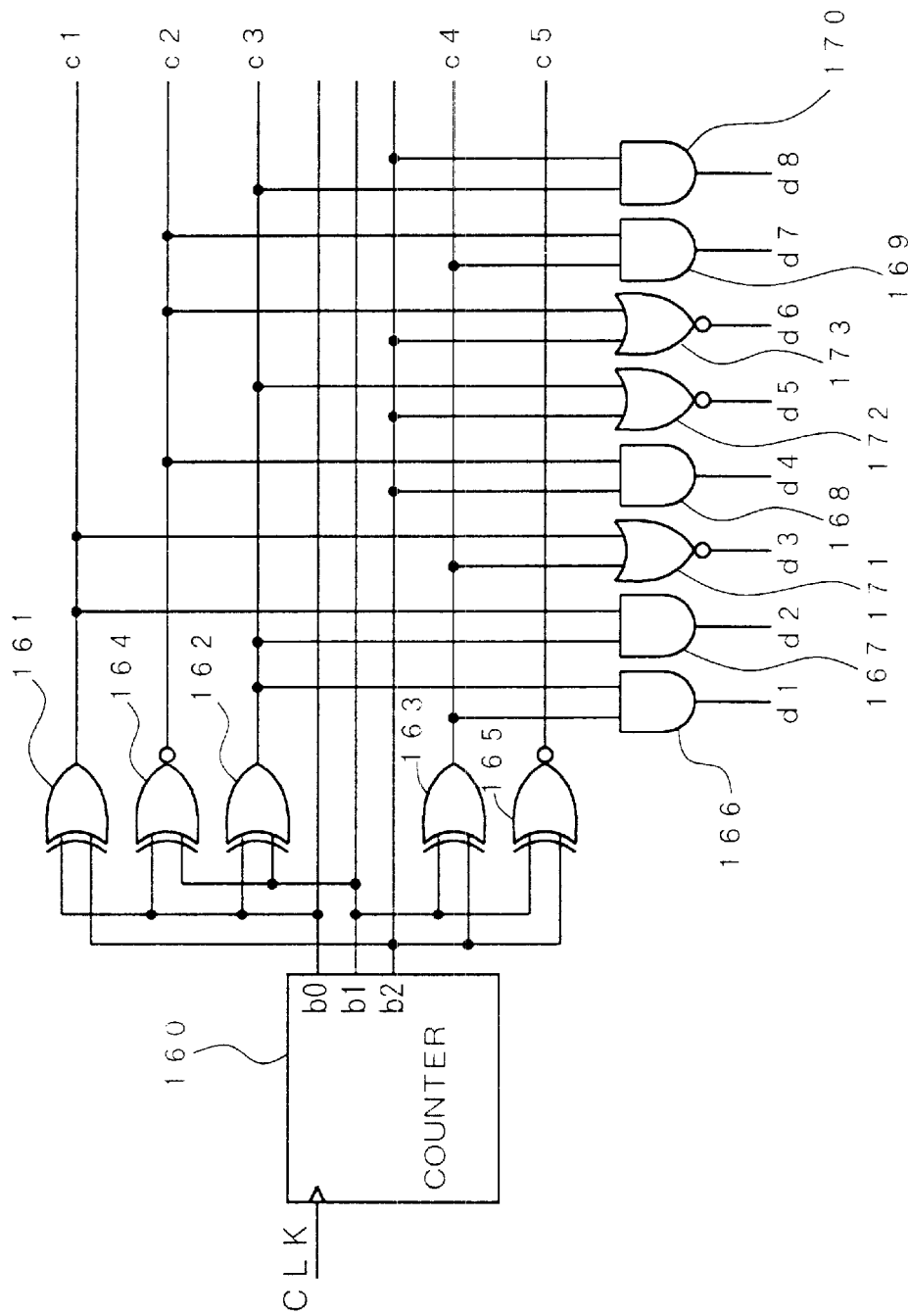
FIG. 14 is a diagram showing a detailed configuration of a timing controller.

FIG. 14 is a diagram showing a detailed configuration of a timing controller 20. As shown in FIG. 14, the timing controller 20 comprises a three-bit counter 160, three exclusive-OR circuits 161 to 163 having the non-inverted output, two exclusive-OR circuits 164, 165 having the inverted output, three AND circuits 166 to 170 having the non-inverted output, and three OR circuits 171 to 173 having the inverted output.

Figure 15:
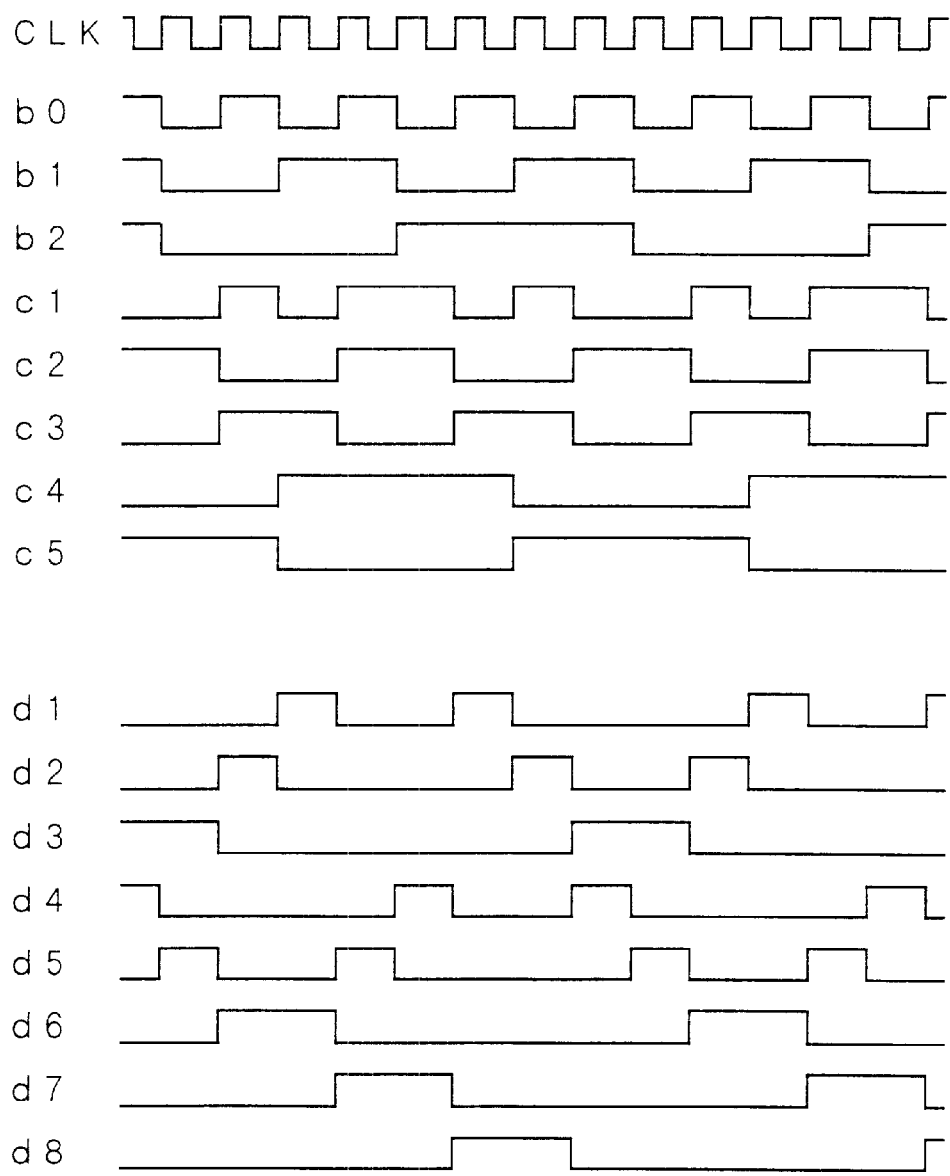
FIG. 15 is a chart showing the operation timings of the timing controller shown in FIG. 14.
Figure 16:
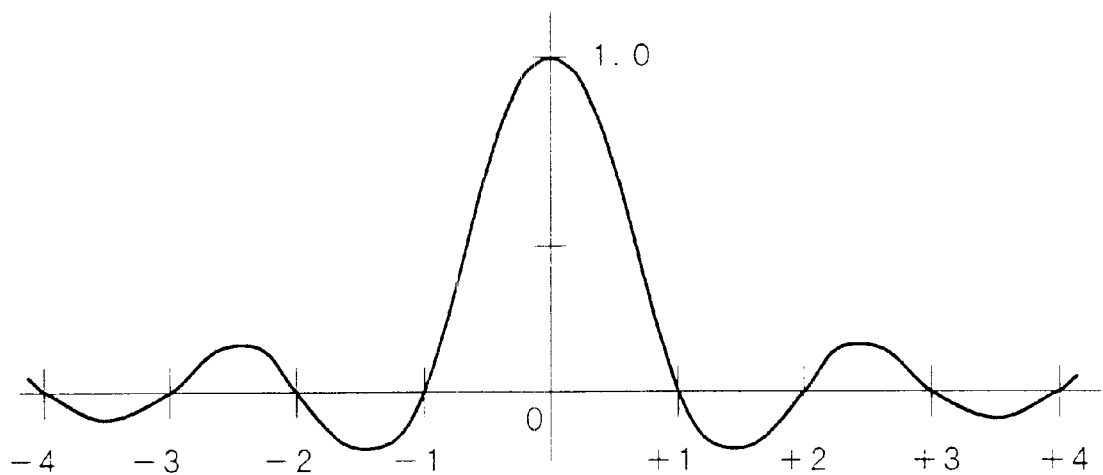
FIG. 16 is an explanatory graph of a sinc function.

FIG. 15 is a chart showing the operation timings of the timing controller 20 shown in FIG. 14. As shown in FIG. 15, the waveforms of CLK, b0 to b2, c1 to c5, and d1 to d8 appear at positions designated by respective signs in FIG. 14. As shown in FIGS. 14 and 15, the three-bit counter 160 performs a counting operation in synchronization with an input clock signal CLK. The three-bit counter 160 counts up every time this clock signal rises, and the three-bit outputs b0, b1, and b2 are updated.

Three switches contained in each of the step function waveform generators 12-1 to 12-4 are switched on or off, using the above-described timing controller 20, to generate each of the step function waveforms shown in FIGS. 7C, 7E, 7G and 7I. More specifically, in order to enable the step function waveform generator 12-1 to generate a step function waveform shown in FIG. 7C, three switches 124 to 126 within this step function waveform generator 12-1 are switched on or off depending on the logical states of an output (d3) of an OR circuit 171, an output (d2) of an AND circuit 167, and an output (d1) of an AND circuit 166, as shown in FIG. 14.

Similarly, in order to enable the step function waveform generator 12-2 to generate a step function waveform shown in FIG. 7E, three switches 124 to 126 within this step function waveform generator 12-2 are switched on or off depending on the logical states of an output (d6) of an OR circuit 173, an output (d5) of an OR circuit 172, and an output (d4) of an AND circuit 168, as shown in FIG. 14. Also, in order to enable the step function waveform generator 12-3 to generate a step function waveform as shown in FIG. 7G, three switches 124 to 126 within this step function waveform generator 12-3 are switched on or off depending on the logical states of an output (d7) of an AND circuit 169, an output (d1) of an AND circuit 166, and an output (d2) of an AND circuit 167, as shown in FIG. 14. Also, in order to enable the step function waveform generator 12-4 to generate a step function waveform as shown in FIG. 7I, three switches 124 to 126 within this step function waveform generator 12-4 are switched on or off depending on the logical states of an output (d8) of an AND circuit 170, an output (d4) of an AND circuit 168, and an output (d5) of an OR circuit 172, as shown in FIG. 14.

The present invention is not limited to the above-described embodiments, but may be modified in various ways within the scope or spirit of the invention. For example, in the embodiments described above, the sampling function is a function of a local support differentiable only once over the whole region, but the sampling function may be differentiable twice or more times. Also, the sampling function of this embodiment converges to zero at t=±2, as shown in FIG. 1, but may converge to zero at t=±3 or beyond. For example, in a case of the sampling function converging to zero at t=±3, six voltage holding sections and six step function waveform generators may be contained in the D/A converter shown in FIG. 6, to generate an analog voltage connecting smoothly six discrete data by performing an interpolation process for the discrete data.

Using a sampling function differentiable finite times having values over the range from −∞ to +∞, rather than a sampling function of a local support, an interpolation process may be performed only for plural digital data corresponding to finite sample point. For example, if such a sampling function is defined by a quadratic piecewise polynomial, the step function waveform can be obtained by differentiating each piecewise polynomial twice. A voltage is combined using this step function waveform, and a resulting voltage is integrated twice to get an analog signal connecting smoothly the voltages corresponding to the digital data.

In the above embodiment, the D/A converter of FIG. 12 is simplified from the circuit partially shown in FIG. 13. However, a D/A converter having the not-simplified circuit shown in FIG. 13 may be employed.

In the above embodiment, when the discrete digital data is input, the digital data is converted into a constant analog voltage, and this analog voltage is held cyclically in each of the voltage holding sections 11-1 to 11-4. However, the input discrete digital data may be held in each of four data holding sections (e.g., D-type flip-flops), and the digital data held may be converted into an analog voltage by passing it through the D/A converter separately.

Industrial Applicability

As described above, with the present invention, a step function waveform corresponding to plural digital data input successively is generated, the waveforms are synthesized, and a resultant waveform is integrated to get an analog voltage that changes continuously. Accordingly, there is no need of using a low pass filter to obtain an ultimate analog signal. Therefore, there is no deterioration of the group delay characteristic caused by variable phase characteristics depending on the frequency of a signal to be processed and less distortion can be obtained.

What is claimed is:

1. A digital-to-analog converter comprising generating a predetermined step function waveform having voltage levels corresponding respectively to a plurality of digital data sequentially input at predetermined intervals and performing an analog integrating a waveform obtained by combining these plurality of step function waveforms by multiple times to generate an analog signal that connects smoothly between the voltages corresponding to the plural digital data.

2. A digital-to-analog converter comprising:
   a plurality of voltage holding sections for holding for predetermined period of time a constant voltage level corresponding to each of plural digital data to be input at a predetermined interval;
   a plurality of step function waveform generators for generating a predetermined step function waveform having a voltage level corresponding to voltage held in the plurality of voltage holding section respectively in synchronization with each timing of inputting the plurality of digital data;
   a voltage summing section for combining the step function waveform generated by each of the step function waveform generators; and
   an integrator for analog integrating multiple times a voltage combined by the voltage summing section.

3. The digital-to-analog converter according to claim 2, wherein said step function waveform comprises a positive region and a negative region set to have an equal area.

4. The digital-to-analog converter according to claim 2, wherein said step function waveform is obtained by differentiating each of piecewise polynomials multiple times, when a sampling function is configured by said piecewise polynomials.

5. The digital-to-analog converter according to claim 4, wherein said sampling function is differentiable only once over the whole region and has values of a local support.

6. The digital-to-analog converter according to claim 5, wherein said sampling function is a function of local support having values other than zero in a range where the sample point t is from −2 to +2, and said sampling function is defined such that:

$(-t^2-4t-4)/4$ for $-2 \leq t < -3/2$, $(3t^2+8t+5)/4$ for $-3/2 \leq t < -1$, $(5t^2+12t+7)/4$ for $-1 \leq t < -1/2$, $(-7t^2+4)/4$ for $-1/2 \leq t < 1/2$, $(5t^2-12t+7)/4$ for $1/2 \leq t < 1$, $(3t^2-8t+5)/4$ for $1 \leq t < 3/2$, and $(-t^2+4t-4)/4$ for $3/2 \leq t \leq 2$.

7. The digital-to-analog converter according to claim 2, wherein said step function consists of eight piecewise sections in equal width with a weight of −1, +3, +5, −7, −7, +5, +3, and −1 in a predetermined range corresponding to said five digital data arranged at an equal interval.

8. The digital-to-analog converter according to claim 5, wherein two analog integral operations are performed, and a continuous analog signal that connects smoothly the voltages corresponding to the plural of digital data is generated.

9. The digital-to-analog converter according to claim 6, wherein two analog integral operations are performed, and a continuous analog signal that connects smoothly the voltages corresponding to the plural of digital data is generated.

* * * * *